United States Patent [19]
Fujioka

[11] Patent Number: 4,945,190
[45] Date of Patent: Jul. 31, 1990

[54] CIRCUIT BOARD DEVICE FOR MAGNETICS CIRCUIT AND METHOD OF MANUFACTURING SAME

[75] Inventor: Yoshiki Fujioka, Yamanashi, Japan

[73] Assignee: Fanuc Ltd., Minamitsuru, Japan

[21] Appl. No.: 276,453

[22] PCT Filed: Apr. 26, 1988

[86] PCT No.: PCT/JP88/00407
§ 371 Date: Nov. 16, 1988
§ 102(e) Date: Nov. 16, 1988

[87] PCT Pub. No.: WO88/08660
PCT Pub. Date: Nov. 3, 1988

[30] Foreign Application Priority Data
Apr. 28, 1987 [JP] Japan ................... 62-105979

[51] Int. Cl.⁵ .............................................. H05K 1/00
[52] U.S. Cl. ................................. 174/68.5; 29/831; 29/832; 361/407
[58] Field of Search ............. 174/685; 361/400, 407; 29/831, 832

[56] References Cited
U.S. PATENT DOCUMENTS 3,370,351 2/1968 Freehauf et al. ............... 174/68.5
3,431,350 3/1969 Haberecht ....................... 361/400
3,501,831 3/1970 Gordon ........................... 174/68.5
3,514,538 5/1970 Chadwick et al. .............. 174/68.5
4,628,409 12/1986 Thompson et al. ............ 361/400 X
4,711,026 12/1987 Swiggett et al. .............. 174/68.5 X

FOREIGN PATENT DOCUMENTS 133761 11/1976 Japan .
45207 3/1980 Japan .
30781 3/1981 Japan .

*Primary Examiner*—Morris H. Nimmo
*Attorney, Agent, or Firm*—Staas & Halsey

[57] ABSTRACT

In a circuit board device for a magnetic circuit and a method of manufacturing the same according to the present invention, there is a printed circuit board on which electric circuits are arranged by use of copper foil portions (3, 4) formed by an etching process on the outer surfaces of an insulating plate (2) made of an electric insulator blank. On this printed circuit board, short bars (5) to serve as conductor pieces for high currents are clinched by burring onto the copper foil portions (3) for passing the high currents, whereupon electric components or the like are fixed to the burred portions by bolts (7), etc.

6 Claims, 2 Drawing Sheets

CIRCUIT BOARD DEVICE FOR MAGNETICS CIRCUIT AND METHOD OF MANUFACTURING SAME

BACKGROUND OF THE INVENTION

This invention relates to a circuit board device for a magnetic circuit for use in wiring an electric circuit which handles a high current, and a method of manufacturing the same.

In recent years, a so-called printed circuit board, in which an electric circuit pattern is formed by the use of printed copper foil for wiring on the front surface of an insulator blank in the shape of a thin plate, has been extensively utilized for connecting an electric circuit.

In a printed circuit board of this type, the electric circuit pattern is prepared by a copper foil etching process, and therefore the thickness of the copper foil to be used is limited. That is, the cross-sectional area of each copper foil portion to form the electric circuit is subject to a certain limitation with regard to the limited area of the circuit board. Accordingly, a printed circuit board of this type is generally used for low-current signal processing circuits, etc.

In a case where a flat magnetic circuit which handles a high current is to be formed, use is made of a circuit board device of the so-called laminated type. That is, conductor pieces which serve as portions for conducting currents are punched and then bonded on an insulating plate. Prescribed power components are properly mounted on the circuit board device for the magnetic circuit, thereby constructing the magnetic circuit.

Each of the two circuit board devices stated above has merits and demerits. By way of example, with the printed circuit board of the former, fabrication is easy but the thickness of the copper foil is limited because of the use of the etching process. Moreover, when the former is applied to a high-current circuit, problems arise due to the current capacity of the current, conducting portion, the generation of heat due to current conduction, etc. With the latter circuit board device for the magnetic circuit wherein the punched conductor pieces are bonded, the foregoing problems can be solved but additional labor is required for the steps of punching and bonding the conductor pieces. Moreover, when an electric circuit in which a low current and a high current coexist is to be formed, the steps become still more complicated. This is a problem which is difficult to solve in terms of cost.

SUMMARY OF THE INVENTION

The present invention has been devised in order to solve such problems, and its object is to provide a circuit board device for a magnetic circuit which is capable of forming conduction paths for large current capacities in a limited area.

Another object of the present invention is to provide a method of manufacturing a circuit board device for a magnetics circuit, which is easy to fabricate and low in cost.

According to the present invention, there is provided a circuit board device for a magnetics circuit, comprising a printed circuit board in which circuit patterns of copper foil are formed by an etching process on plate surfaces of an electric insulator blank that is formed with openings penetrating both the surfaces, and short bars fastened to the copper foil portions including the openings and which serve as conductor pieces for the high currents. Through-holes somewhat smaller in diameter than the openings are provided in positions of the short bars corresponding to the openings. Peripheral end parts of the through-holes are burred to secure mechanical and electrical connections.

In addition, according to the present invention, there is provided a method of manufacturing a circuit board device for a magnetic circuit, comprising the steps of forming a solder layer on an outer surface of each copper foil portion to which a short bar is to be fastened, placing the corresponding short bar on the solder layer and then bringing the short bar into pressing contact with the solder lazer by means of a heating roller, and mechanically fixing the short bar by the burring in the openings which penetrate both surfaces of the printed circuit board.

Thus, with the circuit board device for a magnetic circuit and the manufacturing method therefor according to the present invention, the short bar in order to serve as the conductor piece for a high current is clinched by the burring onto the copper foil portion that is required to conduct the high current, and the terminal portion of an electric component for the high current can be screwed into the burred hole. The effects are that the current capacity of the current conduction portion can be enlarged and that fear of losses such as by heat generation is eliminated.

In addition, according to the present invention, an electric circuit for a high current and an electric circuit for a low current can be disposed on both surfaces of the printed board and then connected through the burred portions. The effect is that the formation of an electric circuit in which the high current and the low current coexist is facilitated.

DESCRIPTION OF THE PREFERRED EMBODIMENT

An embodiment of the present invention will now be described in detail with reference to the drawings.

Figure 1:
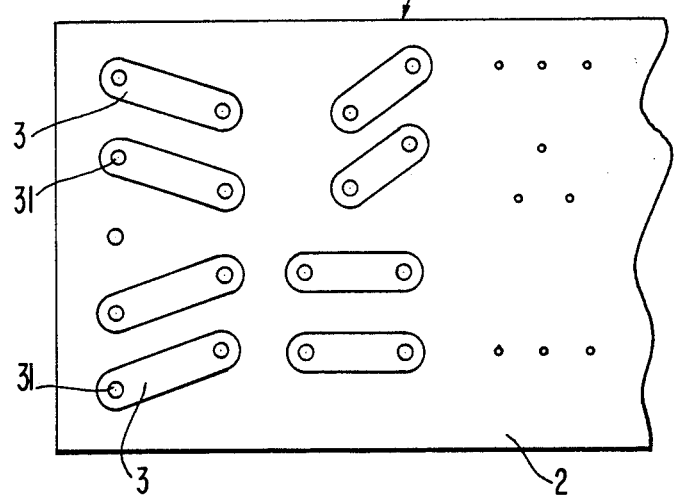
FIG. 1 is a diagram of the upper surface of a printed board according to an embodiment of the present invention.
Figure 2:
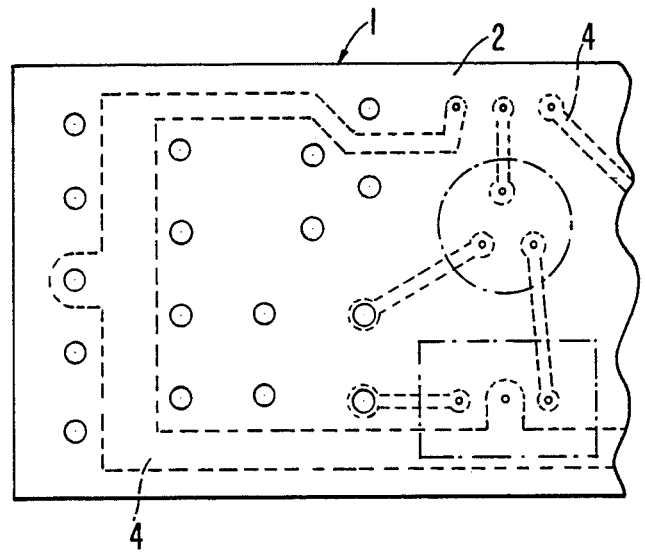
FIG. 2 is a diagram view of the lower surface pattern of the printed board in FIG. 1 as seen through this printed board from above.

In FIGS. 1 and 2, numeral 2 denotes an insulating plate which is an insulator blank in the shape of a thin plate and which serves as the base material of a printed board 1. Copper foil portions 3 and 4 are formed into predetermined shapes by an etching process and are respectively fastened onto the upper and lower surfaces of the insulating plate. Here the copper foil portions 3 on the upper surface serve as a high-current circuit, while the copper foil portions 4 on the lower surface serve as a signal current circuit or a low-current circuit. They function as leads for electrically connecting various electric components to be subsequently mounted on the printed board 1.

Figure 3:
FIG. 3 is a plan view of an example of a short bar.

FIG. 3 is a plan view of an example of the shape of a short bar 5 which functions as a conductor for high currents. The short bar 5 is formed by punching, for example copper plate, having a thickness of 1 mm, into the same shape as that of the corresponding copper foil portion 3. The end parts thereof are provided with through-holes 51 each having a diameter smaller by a predetermined value than that of an opening 31 which is provided in the copper foil portion 3 as well as the insulating plate 2 while penetrating both surfaces of the printed board 1.

In splicing the short bar 5 to the corresponding copper foil portion 3, the upper surface of the copper foil portion 3 is coated with a solder, the short bar 5 is placed on the resulting upper surface of the copper foil portion 3, and the short bar 5 is brought into pressing contact with the solder layer by a heating roller. After such splicing, each through-hole 51 at the end part of the short bar is machined with respect to the opening 31 of the printed board 1 in such a manner that the peripheral end part of the through-hole 51 is bent into the opening 31 and is burred, whereby the short bar 5 is mechanically clinched and electrically coupled to the copper foil portion 3.

Figure 4A:
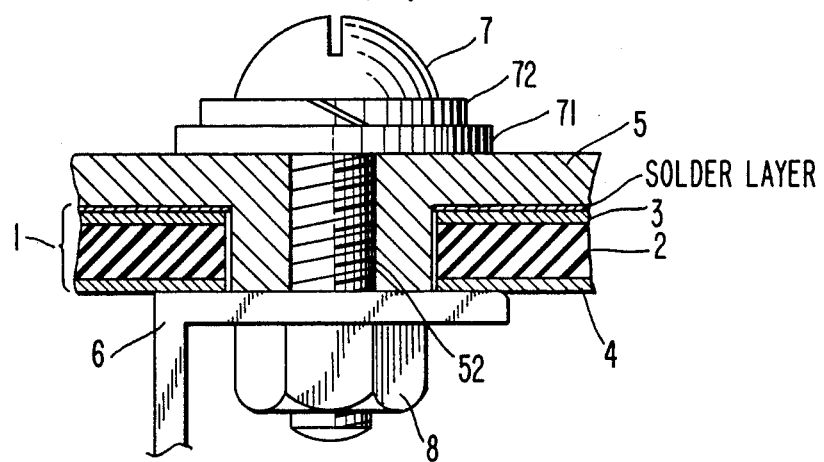
FIGS. 4(a) and 4(b) are enlarged sectional views of the connection between a copper foil portion and an electric component.
Figure 4B:
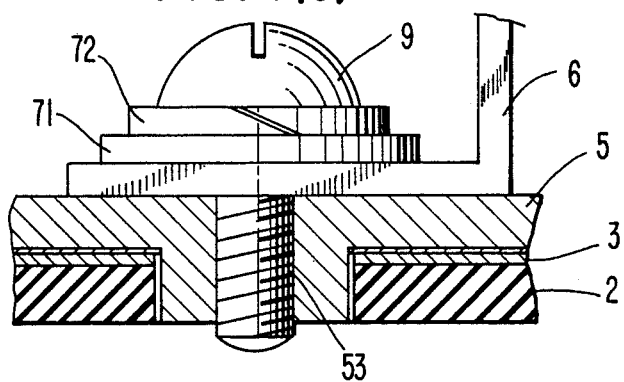

FIGS. 4a and 4b enlarged sectional views illustrating the connection between the copper foil portion 3 subjected to clinching and an electric component for a high current. FIG. 4(a) depicts the state in which the electric component is mounted on the lower surface side of the printed board 1, while FIG. 4(b) depicts the state in which the electric component is mounted on the upper surface side thereof.

In FIG. 4(a), the terminal portion 6 of the electric component is fixed to the clinched short bar 5 by the machined hole 52 of the latter using a bolt 7 as well as a nut 8, thereby establishing the mechanical and electrical connections of the terminal portion with the printed circuit board 1. In FIG. 4(b), the terminal portion 6 is clamped and fixed by a bolt 9 threadably engaged with a machined hole 53 formed by threading the portion of the through-hole 51 of the short bar 5 after clinching.

Numeral 71 denotes a washer, and numeral 72 designates a spring washer.

In this embodiment the electric circuit for a low current is wired and operated by the copper foil portions 4 on the lower surface of the printed board 1. On the other hand, the electric circuit for a high current is operated as a circuit of large current capacity because the short bars 5 clinched to the copper foil portions 3 on the upper surface of the printed board 1 conduct high currents. This makes it easier to dispose the high-current electric circuit and the low-current electric circuit within a limited area on a single printed board.

In this embodiment, both the upper and lower surfaces of the printed board 1 are respectively provided with the copper foil portions. In a simple electric circuit, however, a high-current circuit can be constructed using the short bars on only one surface.

Though an embodiment of the present invention has been described, the invention is not limited thereto and can be modified in a variety of ways without departing from the scope of the claims.

In the circuit board device for a magnetic circuit and the method of manufacturing the same according to the present invention, electric circuits are respectively formed on the front and rear surfaces of a printed circuit board by the use of copper foils, and conductors for high currents are clinched in portions for passing the high current, thereby simplifying the manufacturing process and lowering cost.

I claim:

1. A circuit board device for a magnetic circuit for use in wiring an electrical circuit which handles a high current, said circuit board device comprising:
   a printed circuit board including:
      an electric insulator blank having openings formed therein penetrating both surfaces; and
      circuit patterns of copper foil formed by an etching process on the surfaces of said electric insulator blank and over the openings in said electric insulator blank; and
   short bars fastened to said circuit patterns of copper foil including said openings in said electric insulator blank for serving as conductor pieces for the high current, through-holes smaller in diameter than said openings in said electric insulator blank being provided in positions on said short bars corresponding to said openings, and peripheral end parts of said through-holes being burred into the openings to form secure mechanical and electrical connections.

2. A circuit board device for a magnetic circuit according to claim 1, wherein said short bars are provided on a first surface of said printed circuit board, and wherein a circuit pattern for low currents is formed on a second surface of said printed circuit board.

3. A circuit board device for a magnetic circuit according to claim 1, wherein each said short bar is spliced to the corresponding copper foil portion by soldering.

4. A circuit board device for a magnetic circuit according to claim 1, further comprising an electric component threadedly engaged to the burred through-holes in the openings receiving said short bar.

5. A circuit board device for a magnetics circuit according to claim 1, further comprising an electric component fixed to the copper-foil circuit pattern of said printed circuit board by said through-holes.

6. A method of manufacturing a printed circuit board device for a magnetic circuit, comprising the steps of:
   (a) forming circuit patterns of copper foil on a printed circuit board;
   (b) forming openings in the printed circuit board extending through the patterns of copper foil and penetrating both surfaces of the printed circuit board;
   (c) forming a solder layer on an outer surface of the copper foil;
   (d) fastening short bars to the copper foil including the openings formed in the copper foil by placing the short bars on the solder layer, bringing the short bars into pressing contact with the solder layer by a heating roller, and mechanically fixing the short bars by burring in the openings.

* * * * *